(12) United States Patent
Zhang et al.

(10) Patent No.: US 9,905,155 B2
(45) Date of Patent: Feb. 27, 2018

(54) GATE DRIVER CIRCUIT, ITS DRIVING METHOD, ARRAY SUBSTRATE AND DISPLAY DEVICE

(71) Applicant: BOE TECHNOLOGY GROUP CO., LTD., Beijing (CN)

(72) Inventors: Yuanbo Zhang, Beijing (CN); Seungwoo Han, Beijing (CN); Haoliang Zheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 99 days.

(21) Appl. No.: 14/906,781

(22) PCT Filed: Jul. 24, 2015

(86) PCT No.: PCT/CN2015/085009
§ 371 (c)(1),
(2) Date: Jan. 21, 2016

(87) PCT Pub. No.: WO2016/127589
PCT Pub. Date: Aug. 18, 2016

(65) Prior Publication Data
US 2016/0372023 A1 Dec. 22, 2016

(30) Foreign Application Priority Data
Feb. 12, 2015 (CN) .......................... 2015 1 0075641

(51) Int. Cl.
*G09G 3/36* (2006.01)
*G09G 3/20* (2006.01)
*G11C 19/28* (2006.01)

(52) U.S. Cl.
CPC .......... *G09G 3/2092* (2013.01); *G11C 19/28* (2013.01); *G11C 19/287* (2013.01);
(Continued)

(58) Field of Classification Search
CPC ......... G09G 3/2092; G09G 2300/0809; G09G 2310/0267; G09G 2310/0286; G11C 19/28–19/287; H03K 5/15093
(Continued)

(56) References Cited

U.S. PATENT DOCUMENTS 6,362,643 B1 * 3/2002 Kim ....................... G09G 3/006
324/760.02
2008/0122774 A1 5/2008 Jo et al.
(Continued)

FOREIGN PATENT DOCUMENTS

CN 1704804 A 12/2005
CN 102012591 A 4/2011
(Continued)

OTHER PUBLICATIONS

Second Office Action regarding Chinese Application No. 201510075641.8, dated Mar. 14, 2017. Translation provided by Dragon Intellectual Property Law Firm.
(Continued)

*Primary Examiner* — Amr Awad
*Assistant Examiner* — Aaron Midkiff
(74) *Attorney, Agent, or Firm* — Harness, Dickey & Pierce, P.L.C.

(57) ABSTRACT

The present disclosure provides a gate driver circuit including at least one set of clock signal lines and multiple levels of shift registers arranged in a cascaded manner. Each set of the clock signal lines includes two clock signal lines. The multiple levels of shift registers is divided into at least one set, and each set of the clock signal lines corresponds to a set of the shift registers. One clock signal line in each set of the clock signal lines is connected to a resetting signal input end of a last-level shift register in the set of the shift registers corresponding to the set of the clock signal lines. The present
(Continued)

disclosure further provides an array substrate, a display device and a method for driving the gate driver circuit.

17 Claims, 4 Drawing Sheets

(52) U.S. Cl.
CPC ............ *G09G 2300/0809* (2013.01); *G09G 2310/0267* (2013.01); *G09G 2310/0286* (2013.01)

(58) Field of Classification Search
USPC ............................................ 345/100; 377/64
See application file for complete search history.

(56) References Cited

U.S. PATENT DOCUMENTS

| | | |
|---|---|---|
| 2011/0058640 A1 | 3/2011 | Shang et al. |
| 2012/0194489 A1* | 8/2012 | Iwamoto ............... G09G 3/3685 345/204 |
| 2014/0168044 A1 | 6/2014 | Hu et al. |
| 2014/0177780 A1 | 6/2014 | Qi et al. |
| 2017/0010731 A1 | 1/2017 | Zhang et al. |

FOREIGN PATENT DOCUMENTS

| | | |
|---|---|---|
| CN | 102598145 A | 7/2012 |
| CN | 102708778 A | 10/2012 |
| CN | 102831860 A | 12/2012 |
| CN | 103021309 A | 4/2013 |
| CN | 103035298 A | 4/2013 |
| CN | 103050077 A | 4/2013 |
| CN | 103730089 A | 4/2014 |
| CN | 103943055 A | 7/2014 |
| CN | 103943083 A | 7/2014 |
| CN | 104318909 A | 1/2015 |
| CN | 104616616 A | 5/2015 |
| CN | 204406960 U | 6/2015 |
| JP | 2012215899 A | 11/2012 |
| KR | 20130101760 A | 9/2013 |
| KR | 20140079106 A | 6/2014 |

OTHER PUBLICATIONS

First Office Action regarding Chinese application No. 201510075641.8, dated Aug. 8, 2016. Translation provided by Dragon Intellectual Property Law Firm.
Written Opinion of the International Searching Authority for international application No. PCT/CN2015/085009.

* cited by examiner

GATE DRIVER CIRCUIT, ITS DRIVING METHOD, ARRAY SUBSTRATE AND DISPLAY DEVICE

CROSS-REFERENCE TO RELATED APPLICATION

The present application is the U.S. national phase of PCT Application No. PCT/CN2015/085009 filed on Jul. 24, 2015, which claims a priority of the Chinese patent application No. 201510075641.8 filed on Feb. 12, 2015, which is incorporated herein by reference in its entirety.

TECHNICAL FIELD

The present disclosure relates to the field of display device, in particular to a gate driver circuit, a method for driving the gate driver circuit, an array substrate and a display device including the gate driver circuit.

BACKGROUND

A gate driver circuit is used to achieve a shift register function, and it includes a plurality of sets of shift registers. For three consecutive shift registers in each set of shift registers, a second shift register is used to input a signal to a third shift register and reset a first shift register, so as to achieve the sequential outputting. Hence, an additional start signal STV needs to be provided to the first shift register so as to initially input each frame, and additional resetting control needs to be performed on the last shift register so as to normally stop the output therefrom.

Figure 1:
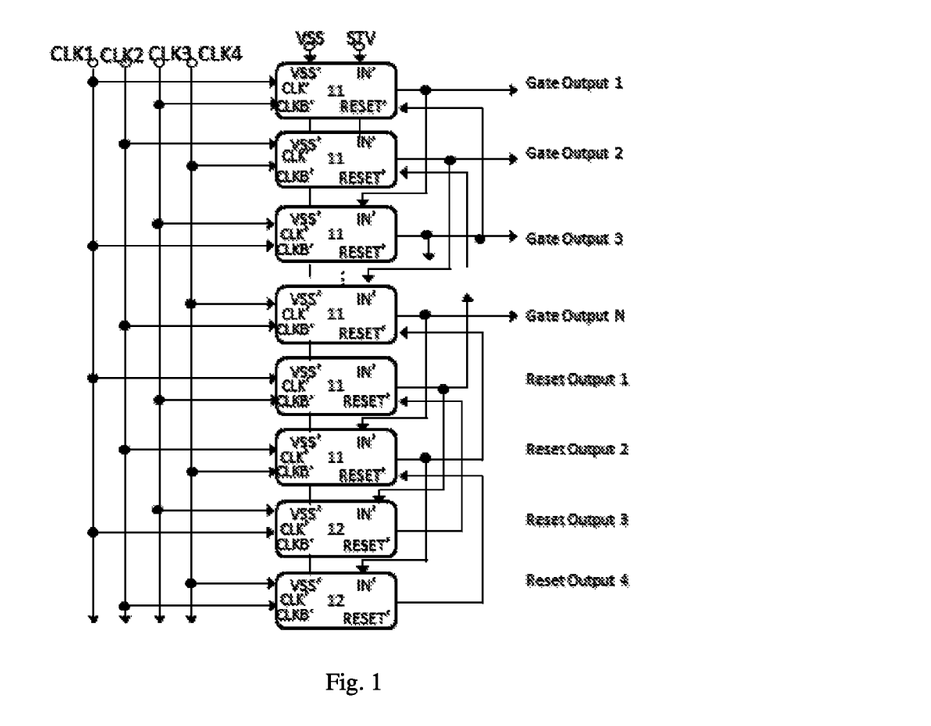
FIG. 1 is a schematic view showing an existing gate driver circuit capable of achieving a resetting function.
Figure 2:
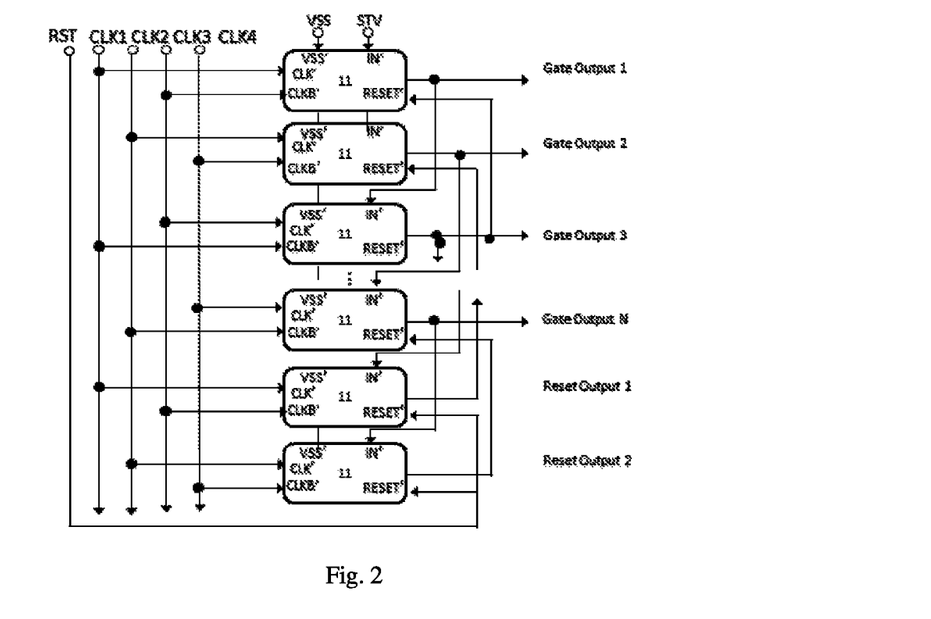
FIG. 2 is a schematic view showing another existing gate driver circuit capable of achieving the resetting function.

FIGS. 1 and 2 are diagrams of a cascading principle of a common gate driver circuit (where four clock signals, i.e., CLK1, CLK2, CLK3 and CLK4 are present). As shown in FIGS. 1 and 2, a shift register 11 corresponding to Gate output N is configured to output a scanning signal to pixels in the last row. In order to ensure the uniform output of the scanning signal to the pixels in the respective rows, an additional set of common shift registers, e.g., the shift registers corresponding to Reset output 1 and Reset output 2, may be used to reset the last shift register for outputting the scanning signal.

In order to normally stop the output from the first shift register for resetting, it is required to perform a resetting operation on the first shift register, e.g., in a method as shown in FIG. 1, the shift register unit corresponding to Reset output 1 and the shift register corresponding to Reset output 2 are reset using two additional shift registers with a self resetting function. To be specific, as shown in FIG. 1, a shift register with a self resetting function outputs Reset output 3 to reset a resetting unit that outputs Reset output 1, and another shift register with a self resetting functions outputs Reset output 4 to reset a resetting unit that outputs Reset output 2. However, it is necessary to provide additional thin film transistors (TFTs) for the shift register with the self-setting function, resulting in an increase in the space occupied by the gate driver circuit. As a result, it is impossible to provide a product with a narrow bezel, and the image quality may be adversely affected.

In a method as shown in FIG. 2, the shift register corresponding to Reset output 1 and the shift register corresponding to Reset output 2 are reset using a resetting signal directly from a driver IC (i.e., using an additional resetting signal line RST). However, it also leads to an increase in a bezel width and the IC's production cost.

Hence, there is an urgent need to reset the shift register in the gate driver circuit without increasing the bezel width.

SUMMARY

An object of the present disclosure is to provide a gate driver circuit, a method for driving the gate driver circuit, an array substrate including the gate driver circuit, and a display device including the array substrate, so as to reset a last-level shift register without any additional element.

In one aspect, the present disclosure provides in some embodiments a gate driver circuit including at least one set of clock signal lines and multiple levels of shift registers arranged in a cascaded manner. Each set of the clock signal lines includes two clock signal lines. The multiple levels of shift registers are divided into at least one set, and each set of the clock signal lines corresponds to a set of the shift registers. One clock signal line in each set of the clock signal lines is connected to a resetting signal input end of a last-level shift register in the set of the shift registers corresponding to the set of the clock signal lines, so as to provide a resetting signal to the resetting signal input end of the last-level shift register in the set of the shift registers at the beginning of a resetting stage.

Alternatively, the gate driver circuit includes an even number of levels of the shift registers, a set of odd-numbered clock signal lines and a set of even-numbered clock signal lines. The set of odd-numbered clock signal lines includes a first odd-numbered clock signal line and a second odd-numbered clock signal line, and the set of even-numbered clock signal lines includes a first even-numbered clock signal line and a second even-numbered clock signal line. The multiple levels of shift registers are divided into a set of odd-numbered shift registers corresponding to gate lines in odd-numbered rows and a set of even-numbered shift registers corresponding to gate lines in even-numbered rows, a last-level shift register in the set of the odd-numbered shift registers serves as an odd-numbered resetting unit, and a last-level shift register in the set of the even-numbered shift registers serves as an even-numbered resetting unit. The first even-numbered clock signal line is connected to an resetting signal input end of the odd-numbered resetting unit, and the second odd-numbered clock signal line is connected to a resetting signal input end of the even-numbered resetting unit. An output end of the odd-numbered resetting unit is connected to an input end of the even-numbered resetting unit and connected to a resetting end of the shift register in the set of the odd-numbered shift registers corresponding to a last odd-numbered gate line, and an output end of the even-numbered resetting unit is connected to a resetting end of the shift register in the set of the even-numbered shift registers corresponding to a last even-numbered gate line.

Alternatively, each shift register includes a first TFT, a second TFT, a third TFT, a fourth TFT, a fifth TFT, a sixth TFT, a seventh TFT, an eighth TFT, a ninth TFT and a storage capacitor. A gate electrode and a first electrode of the first TFT are connected to a signal input end of the shift register and a second electrode of the first TFT is connected to a first electrode of the second TFT. A gate electrode of the second TFT is connected to a resetting signal input end of the shift register, and a second electrode of the second TFT is connected to a low level input end. A first electrode of the third TFT is connected to a first clock signal input end, a gate electrode of the third TFT is connected to the second electrode of the first TFT, and a second electrode of the third TFT is connected to a signal output end of the shift register unit. A first electrode of the fourth TFT is connected to a second clock signal input end, a second electrode of the fourth TFT is connected to a first electrode of the fifth TFT, and a gate electrode of the fourth TFT is connected to a second electrode of the seventh TFT. A gate electrode of the fifth TFT is connected to the gate electrode of the third TFT, and a second electrode of the fifth TFT is connected to the low level input end. A gate electrode of the sixth TFT is connected to the gate electrode of the fifth TFT, a first electrode of the sixth TFT is connected to the gate electrode of the fourth TFT and a second electrode of the sixth TFT is connected to the low level input end. A gate electrode of the seventh TFT is connected to the second clock signal input end, and a first electrode of the seventh TFT is connected to the gate electrode of the seventh TFT. A gate electrode of the eighth TFT is connected to a gate electrode of the ninth TFT and the first electrode of the fifth TFT, a first electrode of the eighth TFT is connected to the first electrode of the second TFT, and a second electrode of the eighth TFT is connected to the low level input end. A first electrode of the ninth TFT is connected to the signal output end of the shift register, and a second electrode of the ninth TFT is connected to the low level input end. A first end of the storage capacitor is connected to the gate electrode of the third TFT, and a second end of the storage capacitor is connected to the signal output end of the shift register unit.

Alternatively, each shift register includes a tenth TFT, a first electrode of which is connected to the first electrode of the ninth TFT, a second electrode of which is connected to the second electrode of the ninth TFT, and a gate electrode of which is connected to the resetting signal input end.

In another aspect, the present disclosure provides in some embodiments an array substrate including the above-mentioned gate driver circuit.

In yet another aspect, the present disclosure provides in some embodiments a display device including the above-mentioned array substrate.

In still yet another aspect, the present disclosure provides in some embodiments a method for driving the above-mentioned gate driver circuit, including a plurality of driving periods. Each driving period includes a display stage and a resetting stage, and the resetting stage includes an outputting stage at a resetting unit, a discharging stage at an output end of the resetting unit and a discharging stage at a pull-up node of the resetting unit. The method includes steps of: at the outputting stage at the resetting unit, inputting a high level signal to a first clock signal input end of the resetting unit, so as to enable the resetting unit to output the high level signal to a resetting end of a previous-level shift register of the resetting unit; at the discharging stage at the output end of the resetting unit, inputting a low level signal to the first clock signal input end and a second clock signal input end of the resetting unit, so as to discharge the output end of the resetting unit; and at the discharging stage at the pull-up node of the resetting unit, inputting a low level signal to the first clock signal input end of the resetting unit, and inputting a high level signal to a resetting signal input end and the second clock signal input end of the resetting unit via a clock signal line, so as to discharge the pull-up node of the resetting unit.

Alternatively, the gate driver circuit includes a set of odd-numbered clock signal lines and a set of even-numbered clock signal lines. The set of odd-numbered clock signal lines includes a first odd-numbered clock signal line and a second odd-numbered clock signal line, and the set of even-numbered clock signal lines includes a first even-numbered clock signal line and a second even-numbered clock signal line. The multiple levels of shift registers are divided into a set of odd-numbered shift registers corresponding to gate lines in odd-numbered rows and a set of even-numbered shift registers corresponding to gate lines in even-numbered rows, a last-level shift register in the set of the odd-numbered shift registers serves as an odd-numbered resetting unit, and a last-level shift register in the set of the even-numbered shift registers serves as an even-numbered resetting unit. In the odd-numbered resetting unit and the even-numbered resetting unit, an output end of the resetting unit of a previous-level shift register is connected to an input end of the resetting unit of a next-level shift register. An output end of the odd-numbered resetting unit is connected to a resetting end of the shift register in the set of the odd-numbered shift registers corresponding to a last odd-numbered gate line, and an output end of the even-numbered resetting unit is connected to a resetting end of the shift register in the set of the even-numbered shift registers corresponding to a last even-numbered gate line. The second odd-numbered clock signal line provides a resetting signal for the odd-numbered resetting unit, and the first even-numbered clock signal line provides a resetting signal for the even-numbered resetting unit.

At the outputting stage at the resetting unit, the method further includes: at an outputting stage at the odd-numbered resetting unit, inputting a high level signal to a first clock signal input end of the odd-numbered resetting unit, so as to enable the odd-numbered resetting unit to output the high level signal to a resetting end of a previous-level shift register of the odd-numbered resetting unit; and at an outputting stage at the even-numbered resetting unit, inputting a high level signal to a first clock signal input end of the even-numbered resetting unit, so as to enable the even-numbered resetting unit to output the high level signal to a resetting end of a previous-level shift register of the even-numbered resetting unit.

At the discharging stage at the output end of the resetting unit, the method further includes: at a discharging stage at an output end of the odd-numbered resetting unit, inputting a low level signal to the first clock signal input end and a second clock signal input end of the odd-numbered resetting unit, so as to discharge the output end of the odd-numbered resetting unit; and at a discharging stage at an output end of the even-numbered resetting unit, inputting a low level signal to the first clock signal input end and a second clock signal input end of the even-numbered resetting unit, so as to discharge the output end of the even-numbered resetting unit.

At the discharging stage at the pull-up node of the resetting unit, the method further includes at a discharging stage at a pull-up node of the odd-numbered resetting unit, inputting a low level signal to the first clock signal input end of the odd-numbered resetting unit, and inputting a high level signal to a resetting signal input end of the odd-numbered resetting unit via the set of the even-numbered clock signal lines, so as to discharge the pull-up node of the odd-numbered resetting unit; and at a discharging stage of a pull-up node of the even-numbered resetting unit, inputting a low level signal to the first clock signal input end of the even-numbered resetting unit, and inputting a high level signal to a resetting signal input end of the even-numbered resetting unit via the set of the odd-numbered clock signal lines, so as to discharge the pull-up node of the even-numbered resetting unit.

Alternatively, the outputting stage at the odd-numbered resetting unit, the discharging stage at the output end of the odd-numbered resetting unit and the discharging stage at the pull-up node of the odd-numbered resetting unit are performed consecutively.

Alternatively, the outputting stage at the even-numbered resetting unit, the discharging stage at the output end of the even-numbered resetting unit and the discharging stage at the pull-up node of the even-numbered resetting unit are performed consecutively.

Alternatively, each shift register includes a first TFT, a second TFT, a third TFT, a fourth TFT, a fifth TFT, a sixth TFT, a seventh TFT, an eighth TFT, a ninth TFT and a storage capacitor. A gate electrode and a first electrode of the first TFT are connected to a signal input end of the shift register and a second electrode of the first TFT is connected to a first electrode of the second TFT. A gate electrode of the second TFT is connected to a resetting signal input end of the shift register, and a second electrode of the second TFT is connected to a low level input end. A first electrode of the third TFT is connected to a first clock signal input end, a gate electrode of the third TFT is connected to the second electrode of the first TFT, and a second electrode of the third TFT is connected to a signal output end of the shift register unit. A first electrode of the fourth TFT is connected to a second clock signal input end, a second electrode of the fourth TFT is connected to a first electrode of the fifth TFT, and a gate electrode of the fourth TFT is connected to a second electrode of the seventh TFT. A gate electrode of the fifth TFT is connected to the gate electrode of the third TFT, and a second electrode of the fifth TFT is connected to the low level input end. A gate electrode of the sixth TFT is connected to the gate electrode of the fifth TFT, a first electrode of the sixth TFT is connected to the gate electrode of the fourth TFT and a second electrode of the sixth TFT is connected to the low level input end. A gate electrode of the seventh TFT is connected to the second clock signal input end, and a first electrode of the seventh TFT is connected to the gate electrode of the seventh TFT. A gate electrode of the eighth TFT is connected to a gate electrode of the ninth TFT and the first electrode of the fifth TFT, a first electrode of the eighth TFT is connected to the first electrode of the second TFT, and a second electrode of the eighth TFT is connected to the low level input end. A first electrode of the ninth TFT is connected to the signal output end of the shift register, and a second electrode of the ninth TFT is connected to the low level input end. A first end of the storage capacitor is connected to the gate electrode of the third TFT, and a second end of the storage capacitor is connected to the signal output end of the shift register unit.

Within an identical driving period, the method further includes: after the display period is ended, providing a high level signal to the first odd-numbered clock signal line, and providing a low level signal to the first even-numbered clock signal line, the second odd-numbered clock signal line and the second even-numbered clock signal line, so as to perform the outputting stage at the odd-numbered resetting unit; after the outputting stage at the odd-numbered resetting unit, providing a low level signal to the first odd-numbered clock signal line, the first even-numbered clock signal line, the second odd-numbered clock signal line and the second even-numbered clock signal line, so as to perform the discharging stage at the output end of the odd-numbered resetting unit; after the discharging charge at the output end of the odd-numbered resetting unit, providing a high level signal to the first even-numbered clocks signal line, and providing a low level signal to the first odd-numbered clock signal line, the second odd-numbered clock signal line and the second even-numbered clock signal line, so as to perform the discharging stage at the pull-up node of the odd-numbered resetting unit and the outputting stage at the even-numbered resetting unit; after the discharging stage at the pull-up node of the odd-numbered resetting unit is ended, providing a low level signal to the first odd-numbered clock signal line, the first even-numbered clock signal line, the second odd-numbered clock signal line and the second even-numbered clock signal line, so as to perform the discharging stage at the output end of the even-numbered resetting unit; and after the discharging stage at the output end of the even-numbered resetting unit, providing a high level signal to the second odd-numbered clock signal line, and providing a low level signal to the first odd-numbered clock signal line, the first even-numbered clock signal line and the second even-numbered clock signal line, so as to perform the discharging stage at the pull-up node of the even-numbered resetting unit.

Alternatively, each shift register includes a first TFT, a second TFT, a third TFT, a fourth TFT, a fifth TFT, a sixth TFT, a seventh TFT, an eighth TFT, a ninth TFT, a tenth TFT and a storage capacitor. A gate electrode and a first electrode of the first TFT are connected to a signal input end of the shift register and a second electrode of the first TFT is connected to a first electrode of the second TFT. A gate electrode of the second TFT is connected to a resetting signal input end of the shift register, and a second electrode of the second TFT is connected to a low level input end. A first electrode of the third TFT is connected to a first clock signal input end, a gate electrode of the third TFT is connected to the second electrode of the first TFT, and a second electrode of the third TFT is connected to a signal output end of the shift register unit. A first electrode of the fourth TFT is connected to a second clock signal input end, a second electrode of the fourth TFT is connected to a first electrode of the fifth TFT, and a gate electrode of the fourth TFT is connected to a second electrode of the seventh TFT. A gate electrode of the fifth TFT is connected to the gate electrode of the third TFT, and a second electrode of the fifth TFT is connected to the low level input end. A gate electrode of the sixth TFT is connected to the gate electrode of the fifth TFT, a first electrode of the sixth TFT is connected to the gate electrode of the fourth TFT and a second electrode of the sixth TFT is connected to the low level input end. A gate electrode of the seventh TFT is connected to the second clock signal input end, and a first electrode of the seventh TFT is connected to the gate electrode of the seventh TFT. A gate electrode of the eighth TFT is connected to a gate electrode of the ninth TFT and the first electrode of the fifth TFT, a first electrode of the eighth TFT is connected to the first electrode of the second TFT, and a second electrode of the eighth TFT is connected to the low level input end. A first electrode of the ninth TFT is connected to the signal output end of the shift register, and a second electrode of the ninth TFT is connected to the low level input end. A first electrode of the tenth TFT is connected to the first electrode of the ninth TFT, a second electrode of the tenth TFT is connected to the second electrode of the ninth TFT, and a gate electrode of the tenth TFT is connected to the resetting signal input end. A first end of the storage capacitor is connected to the gate electrode of the third TFT, and a second end of the storage capacitor is connected to the signal output end of the shift register unit.

Within an identical driving period, the method further includes: from a moment half a pulse before the ending of the display stage, providing a low level signal to the first odd-numbered clock signal line and the first even-numbered clock signal line, and providing a high level signal to the second odd-numbered clock signal line and the second even-numbered clock signal line, so as to charge the pull-up node of the odd-numbered resetting unit; after the pull-up node of the odd-numbered resetting unit has been charged, performing the outputting stage at the odd-numbered resetting unit, providing a high level signal to the first odd-numbered clock signal line and the second even-numbered clock signal line, and providing a low level signal to the first even-numbered clock signal line and the second odd-numbered clock signal line, so as to charge the pull-up node of the even-numbered resetting unit; after the pull-up node of the even-numbered resetting unit has been charged, performing the output stage at the even-numbered resetting unit, providing a high level signal to the first even-numbered clock signal line, and providing a low level signal to the first odd-numbered clock signal line, the second odd-numbered clock signal line and the second even-numbered clock signal line, so as to turn on the second TFT and the tenth TFT of the odd-numbered resetting unit, thereby to perform a pull-down stage at the pull-up node of the odd-numbered resetting unit and a pull-down stage at the output end of the odd-numbered resetting unit simultaneously; and after the pull-down stage at the pull-up node of the odd-numbered resetting unit and the pull-down stage at the output end of the odd-numbered resetting unit are ended, providing a high level signal to the second odd-numbered clock signal line, and providing a low level signal to the first odd-numbered clock signal line, the first even-numbered clock signal line and the second even-numbered clock signal line, so as to turn on the second TFT and the tenth TFT of the even-numbered resetting unit, thereby to perform a pull-down stage at the pull-up node of the even-numbered resetting unit and a pull-down stage at the output end of the even-numbered resetting unit simultaneously.

Alternatively, a pulse width of a clock signal at the resetting stage is half a width of a pulse signal at the display stage.

According to the embodiments in the present disclosure, the clock signal line for providing the clock signal is also used to provide a resetting signal for the shifter register as the resetting unit, so it is unnecessary to provide additional resetting unit or additional TFT in the gate driver circuit. As a result, it is able to simply an overall structure of the gate driver circuit, thereby to provide the display device including the gate driver circuit with a narrow bezel.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 3:
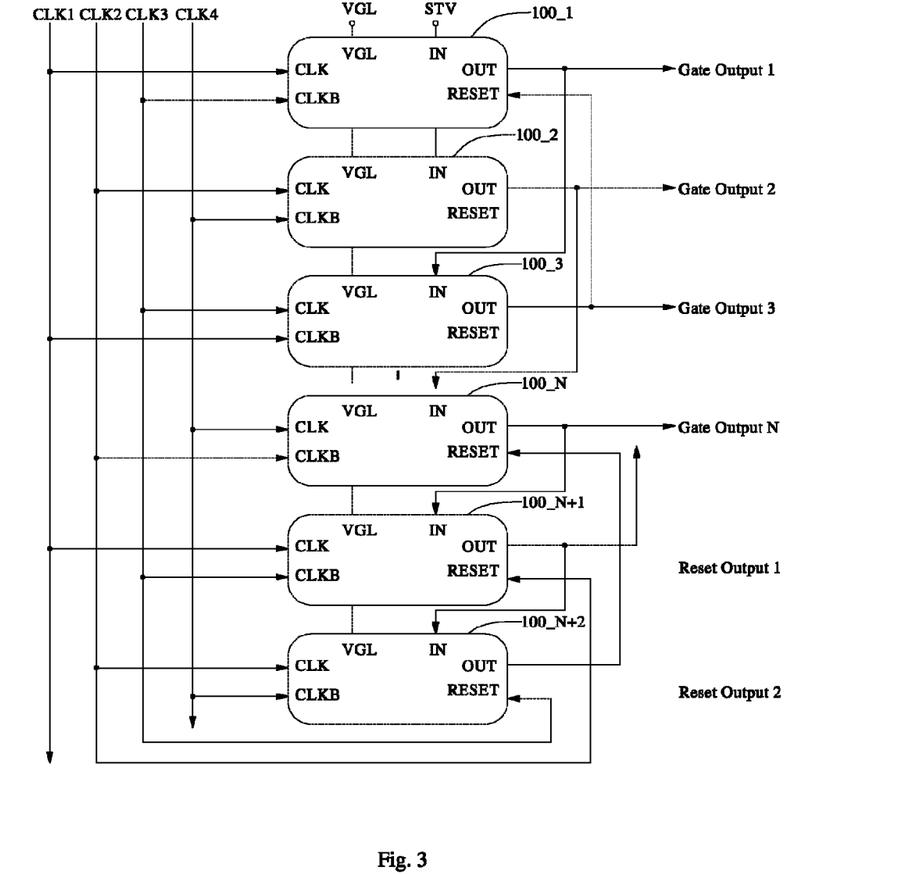
FIG. 3 is a schematic view showing a gate driver circuit according to at least one embodiment of the present disclosure.

As shown in FIG. 3, the present disclosure provides in some embodiments a gate driver circuit including at least one set of clock signal lines and multiple levels of shift registers arranged in a cascaded manner (e.g., a first-level shift register 100_1, a second-level shift register 100_2, a third-level shift register 100_3, . . . , an $N^{th}$-level shift register 100_N, an $(N+1)^{th}$-level shift register 100_N+1, and an $(N+2)^{th}$-level shift register 100_N+2 as shown in FIG. 3). Each set of the clock signal lines includes two clock signal lines. The multiple levels of shift registers is divided into at least one set, and each set of the clock signal lines corresponds to a set of the shift registers. One clock signal line in each set of the clock signal lines is connected to a resetting signal input end of a last-level shift register in the set of the shift registers corresponding to the set of the clock signal lines, so as to provide a resetting signal thereto at the beginning of a resetting stage. A circuit for generating a clock signal is arranged outside the display panel, so no influence may be caused to a narrow-bezel design for a display device including the gate driver circuit.

In the embodiments of the present disclosure, the number of sets of the shift registers is identical to the number of the sets of the clock signal lines. For example, when the gate driver circuit includes n sets of the clock signal lines, it may also include n sets of the shift registers, and a last-level shift register in each set of the shift registers serves as a resetting unit for the set of the shift registers. In the embodiments of the present disclosure, the clock signal line for providing the clock signal is also used to provide a resetting signal for the shifter register as the resetting unit, so it is unnecessary to provide additional resetting unit or additional TFT in the gate driver circuit. As a result, it is able to simply an overall structure of the gate driver circuit, thereby to provide the display device including the gate driver circuit with a narrow bezel.

It should be appreciated that, in order to provide the resetting signal for the resetting unit via the clock signal line, it is required to redesign a time sequence of the clock signals, which will be described hereinafter.

Usually, the gate driver circuit for a display panel includes an even number of levels of the shift registers. In the embodiment as shown in FIG. 3, the gate driver circuit includes an even number of levels of the shift registers, a set of odd-numbered clock signal lines and a set of even-numbered clock signal lines. The set of odd-numbered clock signal lines includes a first odd-numbered clock signal line CLK1 and a second odd-numbered clock signal line CLK3, and the set of even-numbered clock signal lines includes a first even-numbered clock signal line CLK2 and a second even-numbered clock signal line CLK4. The multiple levels of shift registers are divided into a set of odd-numbered shift registers corresponding to gate lines in odd-numbered rows and a set of even-numbered shift registers corresponding to gate lines in even-numbered rows, a last-level shift register in the set of the odd-numbered shift registers serves as an odd-numbered resetting unit, and a last-level shift register in the set of the even-numbered shift registers serves as an even-numbered resetting unit. The first even-numbered clock signal line CLK2 is connected to a resetting signal input end of the odd-numbered resetting unit, and the second odd-numbered clock signal line CLK3 is connected to a resetting signal input end of the even-numbered resetting unit. An output end of the odd-numbered resetting unit is connected to an input end of the even-numbered resetting unit and connected to a resetting end of the shift register corresponding to a last odd-numbered gate line, and an output end of the even-numbered resetting unit is connected to a resetting end of the shift register corresponding to a last even-numbered gate line. It should be appreciated that, the odd-numbered resetting unit and the even-numbered resetting unit are two levels of the shift registers adjacent to each other, and at this time, their connection mode cannot be referred to as a cascading mode.

As mentioned above, FIG. 3 shows the first-level shift register 100_1, the second-level shift register 100_2, the third-level shift register 100_3, . . . , the $N^{th}$-level shift register 100_N, the $(N+1)^{th}$-level shift register 100_N+1, and the $(N+2)^{th}$-level shift register 100_N+2, where N is a even number. Hence, the second odd-numbered clock signal line CLK3 is connected to a reset end RESET of the shift register 100_N+2 in the set of the even-numbered shift registers which serves as the even-numbered resetting unit and provides a resetting signal thereto, and the first even-numbered clock signal line CLK2 is connected to a reset end RESET of the shift register 100_N+1 in the set of the odd-numbered shift registers which serves as the odd-numbered resetting unit and provides a resetting signal thereto.

Figure 4:
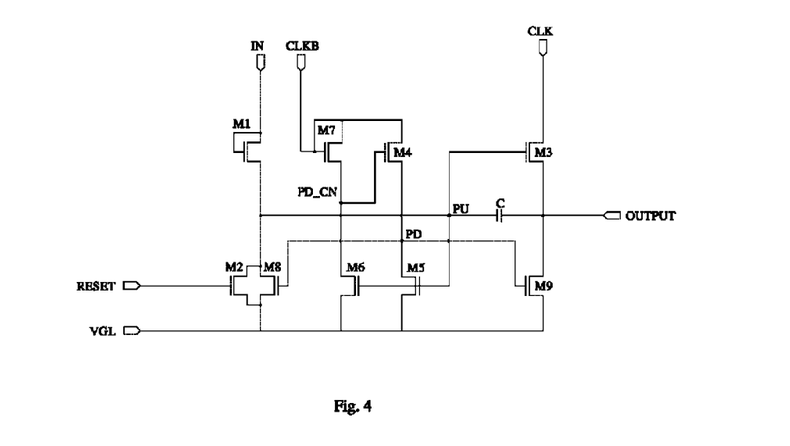
FIG. 4 is a circuit diagram of a shift register in the gate driver circuit in FIG. 3.

In the embodiments of the present disclosure, a structure of each shift register is not particularly defined. Alternatively, as shown in FIG. 4, each shift register may be of a 9T1C-based structure. To be specific, each shift register includes a first TFT M1, a second TFT M2, a third TFT M3, a fourth TFT M4, a fifth TFT M5, a sixth TFT M6, a seventh TFT M7, an eighth TFT M8, a ninth TFT M9 and a storage capacitor C. A gate electrode and a first electrode of the first TFT M1 are connected to a signal input end IN of the shift register and a second electrode of the first TFT M1 is connected to a first electrode of the second TFT M2. A gate electrode of the second TFT M2 is connected to a resetting signal input end RESET of the shift register, and a second electrode of the second TFT M2 is connected to a low level input end VGL. A first electrode of the third TFT M3 is connected to a first clock signal input end, a gate electrode of the third TFT M3 is connected to the second electrode of the first TFT M1, and a second electrode of the third TFT M3 is connected to a signal output end OUTPUT of the shift register unit. A first electrode of the fourth TFT M4 is connected to a second clock signal input end, a second electrode of the fourth TFT M4 is connected to a first electrode of the fifth TFT M5, and a gate electrode of the fourth TFT M4 is connected to a second electrode of the seventh TFT M7. A gate electrode of the fifth TFT M5 is connected to the gate electrode of the third TFT M3, and a second electrode of the fifth TFT M5 is connected to the low level input end VGL. A gate electrode of the sixth TFT M6 is connected to the gate electrode of the fifth TFT M5, a first electrode of the sixth TFT M6 is connected to the gate electrode of the fourth TFT M4 and a second electrode of the sixth TFT M6 is connected to the low level input end VGL. A gate electrode of the seventh TFT M7 is connected to the second clock signal input end, and a first electrode of the seventh TFT M7 is connected to the gate electrode of the seventh TFT M7. A gate electrode of the eighth TFT M8 is connected to a gate electrode of the ninth TFT M9 and the first electrode of the fifth TFT M5, a first electrode of the eighth TFT M8 is connected to the first electrode of the second TFT M2, and a second electrode of the eighth TFT M8 is connected to the low level input end VGL. A first electrode of the ninth TFT M9 is connected to the signal output end OUTPUT of the shift register, a second electrode of the ninth TFT M9 is connected to the low level input end VGL, and a gate electrode of the ninth TFT M9 is connected to the gate electrode of the eighth TFT M8. A first end of the storage capacitor C is connected to the gate electrode of the third TFT M3, and a second end of the storage capacitor C is connected to the signal output end OUTPUT of the shift register unit.

In the 9T1C-based shift register in FIG. 4, the first end of the storage capacitor C is formed into a pull-up node PU, to which the second electrode of the first TFT M1, the gate electrode of the third TFT M3, the gate electrode of the fifth TFT M5 and the gate electrode of the sixth TFT M6 are connected. The first electrode of the fifth TFT M5 is formed into a pull-down node PD, to which the second electrode of the fourth TFT M4, the gate electrode of the eighth TFT M8 and the gate electrode of the ninth TFT M9 are connected. The gate electrode of the fourth TFT M4 is formed into a pull-down control node PD, to which the second electrode of the seventh TFT M7 and the first electrode of the sixth TFT M6 are connected.

It should be appreciated that, the first clock signal input end is connected to the first odd-numbered clock signal line CLK1 or the first even-numbered clock signal line CLK2, and the second clock signal input end is connected to the second odd-numbered clock signal line CLK3 or the second even-numbered clock signal line CLK4.

The shift register unit in FIG. 4 merely includes nine TFTs and one capacitor, so it may occupy a relatively small space.

Figure 5:
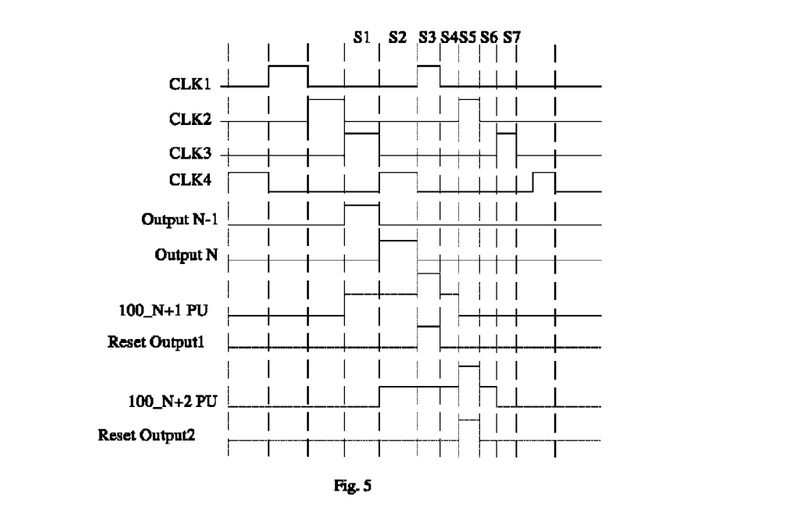
FIG. 5 is a time sequence diagram of the gate driver circuit when it includes the shift register in FIG. 4.

FIG. 5 is a time sequence diagram of the gate driver circuit including the shift registers in FIG. 4, and the time sequence will be described hereinafter.

Figure 6:
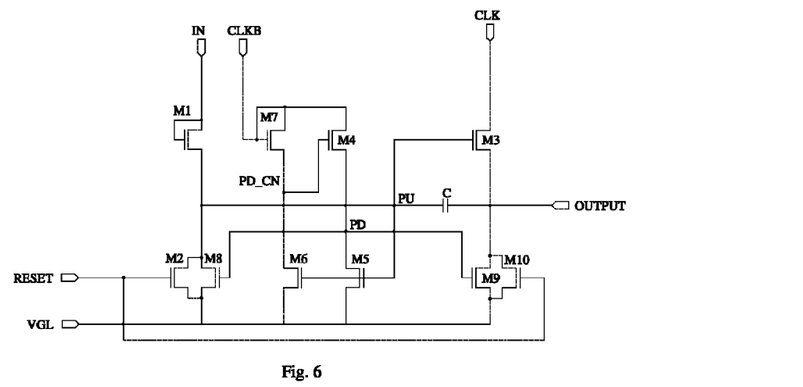
FIG. 6 is another circuit diagram of the shift register in the gate driver circuit in FIG. 3.

FIG. 6 shows a 10T1C-based shift register. As compared with the shift register in FIG. 4, the shift register in FIG. 6 further includes a tenth TFT M10, a first electrode of which is connected to the ninth TFT M9, a second electrode of which is connected to the second electrode of the ninth TFT M9, and a gate electrode of which is connected to the resetting signal input end RESET. With the additional tenth TFT M10, it is able to discharge the output end OUTPUT of the shift register more quickly.

The present disclosure further provides in some embodiments an array substrate including the above-mentioned gate driver circuit.

For the gate driver circuit in the embodiments of the present disclosure, it is unnecessary to provide an additional element for resetting the last-level shift register, so it is able to simply the structure of the gate driver circuit, thereby to provide a product with a narrow bezel.

The present disclosure further provides a display device including the above-mentioned array substrate. As mentioned above, it is able to provide the display device with a narrow bezel.

The present disclosure further provides in some embodiments a method for driving the above-mentioned gate driver circuit, which includes a plurality of driving periods. Each driving period includes a display stage and a resetting stage, and the resetting stage includes an outputting stage at a resetting unit, a discharging stage at an output end of the resetting unit and a discharging stage at a pull-up node of the resetting unit. The method includes steps of: at the outputting stage at the resetting unit, inputting a high level signal to a first clock signal input end of the resetting unit, so as to enable the resetting unit to output the high level signal to a resetting end of a previous-level shift register; at the discharging stage at the output end of the resetting unit, inputting a low level signal to the first clock signal input end and a second clock signal input end of the resetting unit, so as to discharge the output end of the resetting unit; and at the discharging stage at the pull-up node of the resetting unit, inputting a low level signal to the first clock signal input end of the resetting unit, and inputting a high level signal to a resetting signal input end and the second clock signal input end of the resetting unit via a clock signal line, so as to discharge the pull-up node of the resetting unit.

At the display stage, apart from the shift register serving as the resetting unit, the shift registers of the gate driver circuit output a scanning signal to the gate lines of the array substrate, so as to display an image. At the resetting stage, the resetting signal is provided to the shift register serving as the resetting unit via the clock signal line, so as to reset the resetting unit, and the output end of the resetting unit outputs a resetting signal to the previous-level shift register of the resetting register so as to reset it. There is a predetermined interval between the outputting stage at the resetting unit and the discharging stage at the resetting unit. It should be appreciated that, the previous-level shift register of the resetting unit is connected to, and provides the scanning line to, a corresponding gate line.

It should be appreciated that, before the resetting stage, a potential at the pull-up node of the shift register serving as the resetting unit has been pulled up to a high level. Each shift register serving the resetting unit is of a structure identical to the other shift registers, so the resetting unit also includes an output module which usually includes a TFT and a storage capacitor. A gate electrode of the TFT of the output module is connected to the pull-up node, its first electrode is connected to the first clock signal input end, and its second electrode is connected to the output end of the current-level shift register. A first end of the storage capacitor of the output module is connected to the pull-up node, and its second end is connected to the output end of the current-level shift register. At the outputting stage at the resetting unit, the pull-up node of the resetting unit is at a high level, so the TFT of the output module is an on state. When a high level is inputted to the first clock signal input end, the output end of the resetting unit outputs a high level signal to a resetting end of the previous-level shift register, so as to reset the previous-level shift register.

At the discharging stage at the output end of the resetting unit, a low level signal is inputted to the first clock signal input end of the resetting unit. At this time, the pull-up node of the resetting unit is still maintained at the high level, so the resetting unit may be discharged using the TFT of the output module.

At the discharging stage at the pull-up node of the resetting unit, a high level signal is inputted to the input end of the resetting unit, so the potential at the pull-up node of the resetting unit may be pulled down using a resetting module inside the resetting unit. How to discharge the pull-up node through the resetting module is known in the art, and thus will not be particularly defined herein.

The resetting signal is provided to the shift register serving as the resetting unit via the clock signal line, so it is unnecessary to provide any additional element, so as to simply the structure of the gate driver circuit.

Usually, a display panel includes an even number of gate lines, so the gate driver circuit includes an even number of the shift registers. As mentioned above, alternatively, the gate driver circuit includes a set of odd-numbered clock signal lines and a set of even-numbered clock signal lines. The set of odd-numbered clock signal lines includes a first odd-numbered clock signal line and a second odd-numbered clock signal line, and the set of even-numbered clock signal lines includes a first even-numbered clock signal line and a second even-numbered clock signal line. The multiple levels of shift registers are divided into a set of odd-numbered shift registers corresponding to gate lines in odd-numbered rows and a set of even-numbered shift registers corresponding to gate lines in even-numbered rows, a last-level shift register in the set of the odd-numbered shift registers serves as an odd-numbered resetting unit, and a last-level shift register in the set of the even-numbered shift registers serves as an even-numbered resetting unit. The second odd-numbered clock signal line provides a resetting signal for the odd-numbered resetting unit, and the first even-numbered clock signal line provides a resetting signal for the even-numbered resetting unit. In addition, the output end of the odd-numbered resetting unit is connected to the input end of the even-numbered resetting unit.

To be specific, at the outputting stage at the resetting unit, the method further includes: at an outputting stage at the odd-numbered resetting unit, inputting a high level signal to a first clock signal input end of the odd-numbered resetting unit, so as to enable the odd-numbered resetting unit to output the high level signal to a resetting end of a previous-level shift register of the odd-numbered resetting unit; and at an outputting stage at the even-numbered resetting unit, inputting a high level signal to a first clock signal input end of the even-numbered resetting unit, so as to enable the even-numbered resetting unit to output the high level signal to a resetting end of a previous-level shift register of the even-numbered resetting unit.

It should be appreciated that, here, the previous-level shift register of the odd-numbered resetting unit refers to the shift register connected to the last odd-numbered gate line, and the previous-level shift register of the even-numbered resetting unit refers to the shift register connected to the last even-numbered gate line.

At the discharging stage at the output end of the resetting unit, the method further includes: at a discharging stage at an output end of the odd-numbered resetting unit, inputting a low level signal to the first clock signal input end and a second clock signal input end of the odd-numbered resetting unit, so as to discharge the output end of the odd-numbered resetting unit; and at a discharging stage at an output end of the even-numbered resetting unit, inputting a low level signal to the first clock signal input end and a second clock signal input end of the even-numbered resetting unit, so as to discharge the output end of the even-numbered resetting unit.

At the discharging stage at the pull-up node of the resetting unit, the method further includes: at a discharging stage at a pull-up node of the odd-numbered resetting unit, inputting a low level signal to the first clock signal input end of the odd-numbered resetting unit, and inputting a high level signal to a resetting signal input end of the odd-numbered resetting unit via the set of the even-numbered clock signal lines, so as to discharge the pull-up node of the odd-numbered resetting unit; and at a discharging stage of a pull-up node of the even-numbered resetting unit, inputting a low level signal to the first clock signal input end of the even-numbered resetting unit, and inputting a high level signal to a resetting signal input end of the even-numbered resetting unit via the set of the odd-numbered clock signal lines, so as to discharge the pull-up node of the even-numbered resetting unit.

In the embodiments of the present disclosure, the odd-numbered resetting unit and the even-numbered resetting unit are reset. It should be appreciated that, the outputting stage at the odd-numbered resetting unit, the discharging stage at the output end of the odd-numbered resetting unit and the discharging stage at the pull-up node of the odd-numbered resetting unit are performed consecutively. Identically, the outputting stage at the even-numbered resetting unit, the discharging stage at the output end of the even-numbered resetting unit and the discharging stage at the pull-up node of the even-numbered resetting unit are performed consecutively.

When the odd-numbered resetting unit is just a previous-level shift register of the even-numbered resetting unit, the outputting stage at the even-numbered resetting unit, the discharging stage at the output end of the even-numbered resetting unit and the discharging stage at the pull-up node of the even-numbered resetting unit are performed sequentially after the discharging stage at the pull-up node of the odd-numbered resetting unit is ended. In contrast, when the even-numbered resetting unit is just a previous-level shift register of the odd-numbered resetting unit, the outputting stage at the odd-numbered resetting unit, the discharging stage at the output end of the odd-numbered resetting unit and the discharging stage at the pull-up node of the odd-numbered resetting unit are performed sequentially after the discharging stage at the pull-up node of the even-numbered resetting unit is ended.

The method for driving the 9T1C-based gate driver circuit in FIG. 4 will be described hereinafter.

As shown in FIG. 5, which is a time sequence diagram of the gate driver circuit of the shift register in FIG. 4, within a display period, Stage S1, Stage S2 and stages prior to Stage S1 are all the display stages, Stage S3 to Stage S7 are the resetting stages. Within an identical display period, the resetting stage is started after the display stage is ended.

Within an identical driving period, the method includes: after the display period is ended, providing a high level signal to the first odd-numbered clock signal line, and providing a low level signal to the first even-numbered clock signal line, the second odd-numbered clock signal line and the second even-numbered clock signal line, so as to perform the outputting stage at the odd-numbered resetting unit; after the outputting stage at the odd-numbered resetting unit, providing a low level signal to the first odd-numbered clock signal line, the first even-numbered clock signal line, the second odd-numbered clock signal line and the second even-numbered clock signal line, so as to perform the discharging stage at the output end of the odd-numbered resetting unit; after the discharging charge at the output end of the odd-numbered resetting unit, providing a high level signal to the first even-numbered clocks signal line, and providing a low level signal to the first odd-numbered clock signal line, the second odd-numbered clock signal line and the second even-numbered clock signal line, so as to perform the charging stage at the pull-up node of the odd-numbered resetting unit and the outputting stage at the even-numbered resetting unit; after the discharging stage at the pull-up node of the odd-numbered resetting unit is ended, providing a low level signal to the first odd-numbered clock signal line, the first even-numbered clock signal line, the second odd-numbered clock signal line and the second even-numbered clock signal line, so as to perform the discharging stage at the output end of the even-numbered resetting unit; and after the discharging stage at the output end of the even-numbered resetting unit, providing a high level signal to the second odd-numbered clock signal line, and providing a low level signal to the first odd-numbered clock signal line, the first even-numbered clock signal line and the second even-numbered clock signal line, so as to perform the discharging stage at the pull-up node of the even-numbered resetting unit.

The method will be described in details in conjunction with FIG. 5, where N is a even number, i.e., the gate driver circuit includes an even number of the shift registers. The shift register 100_N+1 in FIG. 3 serves as the odd-numbered resetting unit and is configured to reset the set of the odd-numbered shift registers (i.e., the $(N-1)^{th}$-level shift register), and the shift register 100_N+2 in FIG. 3 serves as the even-numbered resetting unit and is configured to reset the set of the even-numbered shift registers (i.e., the $N^{th}$-level shift register).

At Stage S1, an output end Output N−1 of the $(N-1)^{th}$-level shift register outputs a scanning signal to a scanning line in an $(N-1)^{th}$ row, and this scanning signal also serves as an input signal to the shift register unit 100_N+1 serving as the odd-numbered resetting unit, so a pull-up node 100_N+1 PU of the shift register 100_N+1 starts to be charged.

At Stage S2, an output end Output N of the $N^{th}$-level shift register outputs a scanning signal to a scanning line in $N^{th}$ row, and this scanning signal also serves as an input signal to the shift register 100_N+2 serving as the resetting unit, so a pull-up node 100_N+2 PU of the shift register 100_N+2 starts to be charged. At this time, the shift register 100_N+1 has been charged and is maintained at a high level.

At Stage S3, which is the outputting stage at the odd-numbered resetting unit, a first odd-numbered clock signal (provided by the first odd-numbered clock signal line CLK1) corresponding to the shift register 100_N+1 is changed to a high level, so the shift register 100_N+1 starts to output 1, so as to reset the pull-up node of the $(N-1)^{th}$-level shift register.

At Stage S4, which is the discharging stage at the output end of the odd-numbered resetting unit, as mentioned above, the first odd-numbered clock signal (provided by the first odd-numbered clock signal line CLK1) is changed to a low level, but the pull-up node of the $(N-1)^{th}$-level shift register is still maintained at the high level, so the output end of the shift register 100_N+1 is discharged through the third TFT M3 and the potential at the output end is pulled down to a low level. It should be appreciated that, the third TFT M3 is just the TFT of the above-mentioned output module.

At Stage S5, which is the discharging stage at the pull-up node of the odd-numbered resetting unit and the outputting stage at the odd-numbered resetting unit, a first even-numbered clock signal corresponding to the shift register 100_N+1 is changed to a high level, so an output end Output N+1 of the shift register 100_N+1 starts to output so as to reset the pull-up nod PU of the $N^{th}$-level shift register 100_N. At this time, both the $(N-1)^{th}$-level shift register and the $N^{th}$-level shift register have been reset, and meanwhile the potential at the pull-up node PU of the shift register 100_N+1 is reset to a low level by the first even-numbered clock signal CLK2.

At Stage S6, which is the discharging stage at the output end of the even-numbered resetting unit, the first even-numbered clock signal (provided by the first even-numbered clock signal line CLK2) is changed to a low level, but the potential at the pull-up node PU of the shift register 100_N+2 is still maintained at the high level, so the output end of the shift register 100_N+2 is discharged through the third TFT M3 to the low level.

At Stage S7, which is the discharging stage at the pull-up node of the even-numbered resetting unit, a second odd-numbered clock signal (provided by the second odd-numbered clock signal line CLK3) is changed to a high level, so as to reset the potential at the pull-up node PU of the shift register unit 100_N+2 to a low level. At this time, all the shift register units have been reset normally, one frame is finished.

It should be appreciated that, when the shift register is of the 9T1C-based structure in FIG. 4, the resetting stage is started only when the display stage is ended.

Within an identical driving period, the method further includes: from a moment half a pulse before the ending of the display stage, providing a low level signal to the first odd-numbered clock signal line and the first even-numbered clock signal line, and providing a high level signal to the second odd-numbered clock signal line and the second even-numbered clock signal line, so as to charge the pull-up node of the odd-numbered resetting unit; after the pull-up node of the odd-numbered resetting unit has been charged, providing a high level signal to the first odd-numbered clock signal line, and providing a low level signal to the first even-numbered clock signal line and the second odd-numbered clock signal line and the second even-numbered clock signal line, so as to charge the pull-up node of the even-numbered resetting unit. The resetting stage includes the steps of: after the pull-up node of the even-numbered resetting unit has been charged, providing a high level signal to the first even-numbered clock signal line, and providing a low level signal to the first odd-numbered clock signal line, the second odd-numbered clock signal line and the second even-numbered clock signal line, so as to turn on the second TFT and the tenth TFT of the odd-numbered resetting unit, thereby to perform a pull-down stage at the pull-up node of the odd-numbered resetting unit and a pull-down stage at the output end of the odd-numbered resetting unit simultaneously; and after the pull-down stage at the pull-up node of the odd-numbered resetting unit and the pull-down stage at the output end of the odd-numbered resetting unit are ended, providing a high level signal to the second odd-numbered clock signal line, and providing a low level signal to the first odd-numbered clock signal line, the first even-numbered clock signal line and the second even-numbered clock signal line, so as to turn on the second TFT and the tenth TFT of the even-numbered resetting unit, thereby to perform a pull-down stage at the pull-up node of the even-numbered resetting unit and a pull-down stage at the output end of the even-numbered resetting unit simultaneously.

Figure 7:
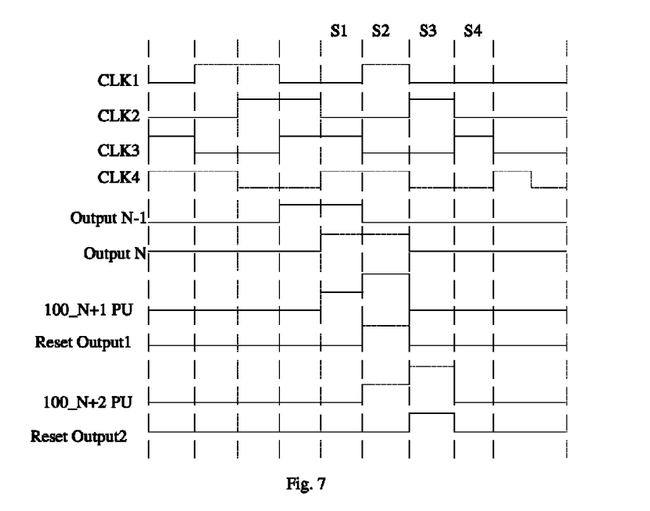
FIG. 7 is a time sequence diagram of the gate driver circuit when it includes the shift register in FIG. 6.

The method for driving the gate driver circuit including the 10T1C-based shift register in FIG. 6 will be described hereinafter. As shown in FIG. 7, N is a even number, i.e., the gate driver circuit includes an even number of the shift registers. The shift register 100_N+1 in FIG. 3 serves as the odd-numbered resetting unit and is configured to reset the set of the odd-numbered shift registers, and the shift register 100_N+2 serves as the even-numbered resetting unit and is configured to reset the set of the even-numbered shift registers.

Within an identical display period, at Stage S1, which starts from a moment half a pulse before the ending of the display stage and which is the charging stage at the pull-up node of the odd-numbered resetting unit, the first odd-numbered clock signal line CLK1 outputs a low level signal, the second odd-numbered clock signal line CLK3 and the second even-numbered clock signal line CLK4 each output a high level signal, and the output end Output N of the $N^{th}$-level shift register 100_N outputs a signal to the shift register 100_N+1 serving as the resetting unit. At this time, the pull-up node 100_N+1 PU of the shift register 100_N+1 starts to be charged.

At Stage S2 subsequent to Stage S1, which is the outputting stage at the odd-numbered resetting unit and the charging stage at the pull-node of the even-numbered resetting unit, the first odd-numbered clock signal line CLK1 outputs a high level signal, the first even-numbered clock signal line CLK2, the second odd-numbered clock signal line CLK3 and the second even-numbered clock signal line CLK4 output a low level signal, and the output end Reset output 1 of the shift register 100_N+1 serving as the resetting unit starts to output a high level, so the $(N-1)^{th}$-level shift register unit is reset normally. The high level signal from the shift register 100_N+1 serving as the resetting unit is also inputted to the shift register 100_N+2 serving as the resetting unit, so the pull-up node 100_N+2 PU of the shift register 100_N+2 starts to be charged.

At Stage S3, which is the outputting stage at the even-numbered resetting unit, the pull-down stage at the output end of the odd-numbered resetting unit and the pull-down stage at the pull-up node of the odd-numbered resetting unit, the first even-numbered clock signal line CLK2 outputs a high level signal, the first odd-numbered clock signal line CLK1, the second odd-numbered clock signal line CLK3 and the second even-numbered clock signal line CLK4 each output a low level signal, and the output end Reset output 2 of the shift register 100_N+2 serving as the resetting unit starts to output a high level, so the output end of the $N^{th}$-level shift register 100_N is normally reset. The first even-numbered clock signal line CLK2 is connected to the resetting end of the shift register 100_N+1 serving as the resetting unit, so the second TFT M2 and the tenth TFT M10 are in the on state. At this time, the potentials at the pull-up node 100_N+1 PU and the output end of the shift register 100_N+1 serving as the resetting unit are pulled down simultaneously to a low level VGL, and the shift register 100_N+1 serving as the resetting unit is normally reset.

At Stage S4, which is the discharging stage at the pull-up node of the even-numbered resetting unit and the discharging stage at the output end of the even-numbered resetting unit, the second odd-numbered clock signal line CLK3 outputs a high level signal, and the first odd-numbered clock signal line CLK1, the first even-numbered clock signal line CLK2 and the second even-numbered clock signal line CLK4 each output a low level signal. The second odd-numbered clock signal line CLK3 is connected to the resetting end of the shift register 100_N+2 serving as the resetting unit, so the second TFT M2 and the tenth TFT M10 are in the on state. At this time, the potentials at the pull-up node 100_N+2 PU and the output end of the shift register 100_N+2 serving as the resetting unit are pulled down simultaneously to the low level VGL, and the shift register 100_N+2 serving as the resetting unit is reset normally. At this time, all the shift registers have been reset normally, and a frame is ended.

Alternatively, a pulse width of a clock signal at the resetting stage is half a width of a pulse signal at the display stage. The resetting unit is not used to charge pixels but merely used to reset the pull-up node of the previous-level shift register, so it is feasible to halve the pulse width of the output signal at the resetting stage.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A gate driver circuit, comprising at least
one set of clock signal lines and multiple levels of shift registers arranged in a cascaded manner, each set of the clock signal lines comprising two clock signal lines, the multiple levels of shift registers being divided into at least one set, and each set of the clock signal lines corresponding to a set of the shift registers, wherein one clock signal line in each set of the clock signal lines is connected to a resetting signal input end of a last-level shift register in the set of the shift registers corresponding to the set of the clock signal lines, so as to provide a resetting signal to the resetting signal input end of the last-level shift register in the set of the shift registers at the beginning of a resetting stage, wherein the gate driver circuit comprises an even number of levels of the shift registers, a set of odd-numbered clock signal lines and a set of even-numbered clock signal lines;
the set of odd-numbered clock signal lines comprises a first odd-numbered clock signal line and a second odd-numbered clock signal line, and the set of even-numbered clock signal lines comprises a first even-numbered clock signal line and a second even-numbered clock signal line;
the multiple levels of shift registers are divided into a set of odd-numbered shift registers corresponding to gate lines in odd-numbered rows and a set of even-numbered shift registers corresponding to gate lines in even-numbered rows, only a last-level shift register in the set of the odd-numbered shift registers serves as an odd-numbered resetting unit, and only a last-level shift register in the set of the even-numbered shift registers serves as an even-numbered resetting unit;
the first even-numbered clock signal line is connected to a resetting signal input end of the odd-numbered resetting unit, and the an output end of the odd-numbered resetting unit is connected to an input end of the even-numbered resetting unit and connected to a resetting end of the shift register in the set of the odd-numbered shift registers corresponding to a last odd-numbered gate line, and an output end of the even-numbered resetting unit is connected to a resetting end of the shift register in the set of the even-numbered shift registers corresponding to a last even-numbered gate line.

2. The gate driver circuit according to claim 1, wherein each shift register comprises a first thin film transistor (TFT), a second TFT, a third TFT, a fourth TFT, a fifth TFT, a sixth TFT, a seventh TFT, an eighth TFT, a ninth TFT and a storage capacitor;
a gate electrode and a first electrode of the first TFT are connected to a signal input end of the shift register and a second electrode of the first TFT is connected to a first electrode of the second TFT;
a gate electrode of the second TFT is connected to a resetting signal input end of the shift register, and a second electrode of the second TFT is connected to a low level input end;
a first electrode of the third TFT is connected to a first clock signal input end, a gate electrode of the third TFT is connected to the second electrode of the first TFT, and a second electrode of the third TFT is connected to a signal output end of the shift register unit;
a first electrode of the fourth TFT is connected to a second clock signal input end, a second electrode of the fourth TFT is connected to a first electrode of the fifth TFT, and a gate electrode of the fourth TFT is connected to a second electrode of the seventh TFT;
a gate electrode of the fifth TFT is connected to the gate electrode of the third TFT, and a second electrode of the fifth TFT is connected to the low level input end;
a gate electrode of the sixth TFT is connected to the gate electrode of the fifth TFT, a first electrode of the sixth TFT is connected to the gate electrode of the fourth TFT and a second electrode of the sixth TFT is connected to the low level input end;
a gate electrode of the seventh TFT is connected to the second clock signal input end, and a first electrode of the seventh TFT is connected to the gate electrode of the seventh TFT;
a gate electrode of the eighth TFT is connected to a gate electrode of the ninth TFT and the first electrode of the fifth TFT, a first electrode of the eighth TFT is connected to the first electrode of the second TFT, and a second electrode of the eighth TFT is connected to the low level input end;
a first electrode of the ninth TFT is connected to the signal output end of the shift register, and a second electrode of the ninth TFT is connected to the low level input end; and
a first end of the storage capacitor is connected to the gate electrode of the third TFT, and a second end of the storage capacitor is connected to the signal output end of the shift register unit.

3. The gate driver circuit according to claim 2, wherein each shift register comprises a tenth TFT, a first electrode of which is connected to the first electrode of the ninth TFT, a second electrode of which is connected to the second electrode of the ninth TFT, and a gate electrode of which is connected to the resetting signal input end.

4. The gate driver circuit according to claim 1, wherein each shift register comprises a first thin film transistor (TFT), a second TFT, a third TFT, a fourth TFT, a fifth TFT, a sixth TFT, a seventh TFT, an eighth TFT, a ninth TFT and a storage capacitor;
a gate electrode and a first electrode of the first TFT are connected to a signal input end of the shift register and a second electrode of the first TFT is connected to a first electrode of the second TFT;

a gate electrode of the second TFT is connected to a resetting signal input end of the shift register, and a second electrode of the second TFT is connected to a low level input end;

a first electrode of the third TFT is connected to a first clock signal input end, a gate electrode of the third TFT is connected to the second electrode of the first TFT, and a second electrode of the third TFT is connected to a signal output end of the shift register unit;

a first electrode of the fourth TFT is connected to a second clock signal input end, a second electrode of the fourth TFT is connected to a first electrode of the fifth TFT, and a gate electrode of the fourth TFT is connected to a second electrode of the seventh TFT;

a gate electrode of the fifth TFT is connected to the gate electrode of the third TFT, and a second electrode of the fifth TFT is connected to the low level input end;

a gate electrode of the sixth TFT is connected to the gate electrode of the fifth TFT, a first electrode of the sixth TFT is connected to the gate electrode of the fourth TFT and a second electrode of the sixth TFT is connected to the low level input end;

a gate electrode of the seventh TFT is connected to the second clock signal input end, and a first electrode of the seventh TFT is connected to the gate electrode of the seventh TFT;

a gate electrode of the eighth TFT is connected to a gate electrode of the ninth TFT and the first electrode of the fifth TFT, a first electrode of the eighth TFT is connected to the first electrode of the second TFT, and a second electrode of the eighth TFT is connected to the low level input end;

a first electrode of the ninth TFT is connected to the signal output end of the shift register, and a second electrode of the ninth TFT is connected to the low level input end; and a first end of the storage capacitor is connected to the gate electrode of the third TFT, and a second end of the storage capacitor is connected to the signal output end of the shift register unit.

5. A method for driving a gate driver circuit, the gate driver circuit comprising at least one set of clock signal lines and multiple levels of shift registers arranged in a cascaded manner, each set of the clock signal lines comprising two clock signal lines, the multiple levels of shift registers being divided into at least one set, and each set of the clock signal lines corresponding to a set of the shift registers, wherein the method comprising a plurality of driving periods, each driving period comprising a display stage and a resetting stage, and the resetting stage comprising an outputting stage at a resetting unit, a discharging stage at an output end of the resetting unit and a discharging stage at a pull-up node of the resetting unit, wherein the method comprises steps of:

at the outputting stage at the resetting unit, inputting a high level signal to a first clock signal input end of the resetting unit, so as to enable the resetting unit to output the high level signal to a resetting end of a previous-level shift register of the resetting unit;

at the discharging stage at the output end of the resetting unit, inputting a low level signal to the first clock signal input end and a second clock signal input end of the resetting unit, so as to discharge the output end of the resetting unit; and at the discharging stage at the pull-up node of the resetting unit, inputting a low level signal to the first clock signal input end of the resetting unit, and inputting a high level signal to a resetting signal input end and the second clock signal input end of the resetting unit via a clock signal line, so as to discharge the pull-up node of the resetting unit, wherein the gate driver circuit comprises an even number of levels of the shift registers, a set of odd-numbered clock signal lines and a set of even-numbered clock signal lines;

the set of odd-numbered clock signal lines comprises a first odd-numbered clock signal line and a second odd-numbered clock signal line, and the set of even-numbered clock signal lines comprises a first even-numbered clock signal line and a second even-numbered clock signal line;

the multiple levels of shift registers are divided into a set of odd-numbered shift registers corresponding to gate lines in odd-numbered rows and a set of even-numbered shift registers corresponding to gate lines in even-numbered rows, only a last-level shift register in the set of the odd-numbered shift registers serves as an odd-numbered resetting unit, and only a last-level shift register in the set of the even-numbered shift registers serves as an even-numbered resetting unit; and an output end of the odd-numbered resetting unit is connected to an input end of the even-numbered resetting unit and connected to a resetting end of the shift register in the set of the odd-numbered shift registers corresponding to a last odd-numbered gate line, and an output end of the even-numbered resetting unit is connected to a resetting end of the shift register in the set of the even-numbered shift registers corresponding to a last even-numbered gate line.

6. The method according to claim 5, wherein the odd-numbered resetting unit is connected to the even-numbered resetting unit in a cascaded manner;

the second odd-numbered clock signal line provides a resetting signal for the odd-numbered resetting unit, and the first even-numbered clock signal line provides a resetting signal for the even-numbered resetting unit;

at the outputting stage at the resetting unit, the method further comprises:

at an outputting stage at the odd-numbered resetting unit, inputting a high level signal to a first clock signal input end of the odd-numbered resetting unit, so as to enable the odd-numbered resetting unit to output the high level signal to a resetting end of a previous-level shift register of the odd-numbered resetting unit, and at an outputting stage at the even-numbered resetting unit, inputting a high level signal to a first clock signal input end of the even-numbered resetting unit, so as to enable the even-numbered resetting unit to output the high level signal to a resetting end of a previous-level shift register of the even-numbered resetting unit;

at the discharging stage at the output end of the resetting unit, the method further comprises:

at a discharging stage at an output end of the odd-numbered resetting unit, inputting a low level signal to the first clock signal input end and a second clock signal input end of the odd-numbered resetting unit, so as to discharge the output end of the odd-numbered resetting unit, and at a discharging stage at an output end of the even-numbered resetting unit, inputting a low level signal to the first clock signal input end and a second clock signal input end of the even-numbered resetting unit, so as to discharge the output end of the even-numbered resetting unit; and at the discharging stage at the pull-up node of the resetting unit, the method further comprises:

at a discharging stage at a pull-up node of the odd-numbered resetting unit, inputting a low level signal to the first clock signal input end of the odd-numbered resetting unit, and inputting a high level signal to a resetting signal input end of the odd-numbered resetting unit via the set of the even-numbered clock signal lines, so as to discharge the pull-up node of the odd-numbered resetting unit, and at a discharging stage of a pull-up node of the even-numbered resetting unit, inputting a low level signal to the first clock signal input end of the even-numbered resetting unit, and inputting a high level signal to a resetting signal input end of the even-numbered resetting unit via the set of the odd-numbered clock signal lines, so as to discharge the pull-up node of the even-numbered resetting unit.

7. The method according to claim 6, wherein the outputting stage at the odd-numbered resetting unit, the discharging stage at the output end of the odd-numbered resetting unit and the discharging stage at the pull-up node of the odd-numbered resetting unit are performed consecutively.

8. The method according to claim 7, wherein a pulse width of a clock signal at the resetting stage is half a width of a pulse signal at the display stage.

9. The method according to claim 7, wherein the outputting stage at the even-numbered resetting unit, the discharging stage at the output end of the even-numbered resetting unit and the discharging stage at the pull-up node of the even-numbered resetting unit are performed consecutively.

10. The method according to claim 6, wherein the outputting stage at the even-numbered resetting unit, the discharging stage at the output end of the even-numbered resetting unit and the discharging stage at the pull-up node of the even-numbered resetting unit are performed consecutively.

11. The method according to claim 10, wherein a pulse width of a clock signal at the resetting stage is half a width of a pulse signal at the display stage.

12. The method according to claim 6, wherein each shift register comprises a first thin film transistor (TFT), a second TFT, a third TFT, a fourth TFT, a fifth TFT, a sixth TFT, a seventh TFT, an eighth TFT, a ninth TFT and a storage capacitor;

a gate electrode and a first electrode of the first TFT are connected to a signal input end of the shift register and a second electrode of the first TFT is connected to a first electrode of the second TFT;

a gate electrode of the second TFT is connected to a resetting signal input end of the shift register, and a second electrode of the second TFT is connected to a low level input end;

a first electrode of the third TFT is connected to a first clock signal input end, a gate electrode of the third TFT is connected to the second electrode of the first TFT, and a second electrode of the third TFT is connected to a signal output end of the shift register unit;

a first electrode of the fourth TFT is connected to a second clock signal input end, a second electrode of the fourth TFT is connected to a first electrode of the fifth TFT, and a gate electrode of the fourth TFT is connected to a second electrode of the seventh TFT;

a gate electrode of the fifth TFT is connected to the gate electrode of the third TFT, and a second electrode of the fifth TFT is connected to the low level input end;

a gate electrode of the sixth TFT is connected to the gate electrode of the fifth TFT, a first electrode of the sixth TFT is connected to the gate electrode of the fourth TFT and a second electrode of the sixth TFT is connected to the low level input end;

a gate electrode of the seventh TFT is connected to the second clock signal input end, and a first electrode of the seventh TFT is connected to the gate electrode of the seventh TFT;

a gate electrode of the eighth TFT is connected to a gate electrode of the ninth TFT and the first electrode of the fifth TFT, a first electrode of the eighth TFT is connected to the first electrode of the second TFT, and a second electrode of the eighth TFT is connected to the low level input end;

a first electrode of the ninth TFT is connected to the signal output end of the shift register, and a second electrode of the ninth TFT is connected to the low level input end;

a first end of the storage capacitor is connected to the gate electrode of the third TFT, and a second end of the storage capacitor is connected to the signal output end of the shift register unit; and within an identical driving period, the method comprises:

after the display period is ended, providing a high level signal to the first odd-numbered clock signal line, and providing a low level signal to the first even-numbered clock signal line, the second odd-numbered clock signal line and the second even-numbered clock signal line, so as to perform the outputting stage at the odd-numbered resetting unit, after the outputting stage at the odd-numbered resetting unit, providing a low level signal to the first odd-numbered clock signal line, the first even-numbered clock signal line, the second odd-numbered clock signal line and the second even-numbered clock signal line, so as to perform the discharging stage at the output end of the odd-numbered resetting unit, after the discharging charge at the output end of the odd-numbered resetting unit, providing a high level signal to the first even-numbered clocks signal line, and providing a low level signal to the first odd-numbered clock signal line, the second odd-numbered clock signal line and the second even-numbered clock signal line, so as to perform the discharging stage at the pull-up node of the odd-numbered resetting unit and the outputting stage at the even-numbered resetting unit, after the discharging stage at the pull-up node of the odd-numbered resetting unit is ended, providing a low level signal to the first odd-numbered clock signal line, the first even-numbered clock signal line, the second odd-numbered clock signal line and the second even-numbered clock signal line, so as to perform the discharging stage at the output end of the even-numbered resetting unit, and after the discharging stage at the output end of the even-numbered resetting unit, providing a high level signal to the second odd-numbered clock signal line, and providing a low level signal to the first odd-numbered clock signal line, the first even-numbered clock signal line and the second even-numbered clock signal line, so as to perform the discharging stage at the pull-up node of the even-numbered resetting unit.

13. The method according to claim 12, wherein a pulse width of a clock signal at the resetting stage is half a width of a pulse signal at the display stage.

14. The method according to claim 6, wherein each shift register comprises a TFT, a second TFT, a third TFT, a fourth TFT, a fifth TFT, a sixth TFT, a seventh TFT, an eighth TFT, a ninth TFT and a storage capacitor;
a gate electrode and a first electrode of the first TFT are connected to a signal input end of the shift register and a second electrode of the first TFT is connected to a first electrode of the second TFT;
a gate electrode of the second TFT is connected to a resetting signal input end of the shift register, and a second electrode of the second TFT is connected to a low level input end;
a first electrode of the third TFT is connected to a first clock signal input end, a gate electrode of the third TFT is connected to the second electrode of the first TFT, and a second electrode of the third TFT is connected to a signal output end of the shift register unit;
a first electrode of the fourth TFT is connected to a second clock signal input end, a second electrode of the fourth TFT is connected to a first electrode of the fifth TFT, and a gate electrode of the fourth TFT is connected to a second electrode of the seventh TFT;
a gate electrode of the fifth TFT is connected to the gate electrode of the third TFT, and a second electrode of the fifth TFT is connected to the low level input end;
a gate electrode of the sixth TFT is connected to the gate electrode of the fifth TFT, a first electrode of the sixth TFT is connected to the gate electrode of the fourth TFT and a second electrode of the sixth TFT is connected to the low level input end;
a gate electrode of the seventh TFT is connected to the second clock signal input end, and a first electrode of the seventh TFT is connected to the gate electrode of the seventh TFT;
a gate electrode of the eighth TFT is connected to a gate electrode of the ninth TFT and the first electrode of the fifth TFT, a first electrode of the eighth TFT is connected to the first electrode of the second TFT, and a second electrode of the eighth TFT is connected to the low level input end;
a first electrode of the ninth TFT is connected to the signal output end of the shift register, and a second electrode of the ninth TFT is connected to the low level input end;
a first electrode of the tenth TFT is connected to the first electrode of the ninth TFT, a second electrode of the tenth TFT is connected to the second electrode of the ninth TFT, and a gate electrode of the tenth TFT is connected to the resetting signal input end;
a first end of the storage capacitor is connected to the gate electrode of the third TFT, and a second end of the storage capacitor is connected to the signal output end of the shift register unit; and within an identical driving period, the method comprises:
from a moment half a pulse before the ending of the display stage, providing a low level signal to the first odd-numbered clock signal line and the first even-numbered clock signal line, and providing a high level signal to the second odd-numbered clock signal line and the second even-numbered clock signal line, so as to charge the pull-up node of the odd-numbered resetting unit,
after the pull-up node of the odd-numbered resetting unit is charged, performing the outputting stage at the odd-numbered resetting unit, providing a high level signal to the first odd-numbered clock signal line and the second even-numbered clock signal line, and providing a low level signal to the first even-numbered clock signal line and the second odd-numbered clock signal line, so as to charge the pull-up node of the even-numbered resetting unit,
after the pull-up node of the even-numbered resetting unit is charged, performing the output stage at the even-numbered resetting unit, providing a high level signal to the first even-numbered clock signal line, and providing a low level signal to the first odd-numbered clock signal line, the second odd-numbered clock signal line and the second even-numbered clock signal line, so as to turn on the second TFT and the tenth TFT of the odd-numbered resetting unit, thereby to perform a pull-down stage at the pull-up node of the odd-numbered resetting unit and a pull-down stage at the output end of the odd-numbered resetting unit simultaneously, and
after the pull-down stage at the pull-up node of the odd-numbered resetting unit and the pull-down stage at the output end of the odd-numbered resetting unit are ended, providing a high level signal to the second odd-numbered clock signal line, and providing a low level signal to the first odd-numbered clock signal line, the first even-numbered clock signal line and the second even-numbered clock signal line, so as to turn on the second TFT and the tenth TFT of the even-numbered resetting unit, thereby to perform a pull-down stage at the pull-up node of the even-numbered resetting unit and a pull-down stage at the output end of the even-numbered resetting unit simultaneously.

15. The method according to claim 14, wherein a pulse width of a clock signal at the resetting stage is half a width of a pulse signal at the display stage.

16. The method according to claim 6, wherein a pulse width of a clock signal at the resetting stage is half a width of a pulse signal at the display stage.

17. The method according to claim 5, wherein a pulse width of a clock signal at the resetting stage is half a width of a pulse signal at the display stage.

* * * * *